(12) United States Patent
Erhart

(10) Patent No.: US 8,666,719 B2
(45) Date of Patent: Mar. 4, 2014

(54) METHODS AND SYSTEMS FOR NUMERICALLY SIMULATING MUSCLE MOVEMENTS ALONG BONES AND AROUND JOINTS

(75) Inventor: Tobias Erhart, Stuttgart (DE)

(73) Assignee: Livermore Software Technology Corp., Livermore, CA (US)

( * ) Notice: Subject to any disclaimer, the term of this patent is extended or adjusted under 35 U.S.C. 154(b) by 341 days.

(21) Appl. No.: 13/280,506

(22) Filed: Oct. 25, 2011

(65) Prior Publication Data

US 2013/0103367 A1    Apr. 25, 2013

(51) Int. Cl.
*G06G 7/58* (2006.01)

(52) U.S. Cl.
USPC ............................................................ 703/11

(58) Field of Classification Search
USPC ......... 703/6, 7, 11; 434/1, 365; 345/373, 474; 601/1; 702/141
See application file for complete search history.

(56) References Cited

U.S. PATENT DOCUMENTS

| 6,750,866 | B1 * | 6/2004 | Anderson, III | 345/474 |
| 2002/0042703 | A1 * | 4/2002 | Furusu et al. | 703/11 |
| 2004/0254771 | A1 * | 12/2004 | Riener et al. | 703/7 |
| 2006/0199167 | A1 * | 9/2006 | Yang et al. | 434/365 |
| 2007/0171225 | A1 * | 7/2007 | Haex et al. | 345/473 |
| 2007/0172797 | A1 * | 7/2007 | Hada et al. | 434/1 |
| 2011/0105962 | A1 * | 5/2011 | Ochi et al. | 601/5 |
| 2011/0267358 | A1 * | 11/2011 | Rennuit et al. | 345/474 |
| 2013/0073248 | A1 * | 3/2013 | Perkins et al. | 702/141 |

* cited by examiner

*Primary Examiner* — Kandasamy Thangavelu
(74) *Attorney, Agent, or Firm* — Roger H. Chu

(57) ABSTRACT

Systems and methods for numerically simulating muscle's movements along bones and around joints are disclosed. A computerized model containing a plurality of truss elements along with one or more rollers is used. The truss elements are configured for modeling a muscle strand while each roller is configured for a joint. Each truss element includes two end nodes and is configured or associated with a muscle biomechanical property model. Each roller is fixed at the location of a corresponding joint. To simulate the muscle strand movements around the joint, each pair of truss elements straddling a roller is adjusted dynamically in a time-marching simulation (e.g., computer simulation of an impact event of an automobile and one or more occupants). Adjustments are performed at each solution cycle of the time-marching simulation. Adjustments include two types—"slipping" and "swapping".

20 Claims, 6 Drawing Sheets

# METHODS AND SYSTEMS FOR NUMERICALLY SIMULATING MUSCLE MOVEMENTS ALONG BONES AND AROUND JOINTS

FIELD

The present invention generally relates to methods, systems and software product used in the area of computer-aided engineering analysis, more particularly to numerical simulation of movements of muscle strand around a joint.

BACKGROUND

Continuum mechanics has been used for simulating continuous matter such as solids and fluids (i.e., liquids and gases). Differential equations are employed in solving problems in continuum mechanics. Many numerical procedures have been used. One of the most popular methods is finite element analysis (FEA), which is a computerized method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are referred to as finite elements. The vertices of the finite elements are referred to as nodes. The model is comprised of a finite number of finite elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

One of the most challenging FEA tasks is to simulate an impact event such as car crash. As the modern computer improves, not only are the vehicle behaviors in a car crash simulated, but also the occupant's movements and reactions. In order to adequately simulating an occupant (i.e., a human), movements according to bio-mechanical properties of a human body (e.g., muscles) need to be model properly in the CAE (e.g., finite element analysis). As of today, there is no satisfactory practical solution. Some of the prior art approaches cause unsmooth or jerky movements due to traditional finite element method, for example, truss element that maintains its original length throughout the simulation. It would therefore be desirable to have method and system for numerically simulating muscle movements along bones and around joints.

SUMMARY

This section is for the purpose of summarizing some aspects of the present application and to briefly introduce embodiments. Simplifications or omissions in this section as well as in the abstract and the title herein may be made to avoid obscuring the purpose of the section. Such simplifications or omissions are not intended to limit the scope of the present application.

Systems and methods for numerically simulating muscle's movements along bones and around joints are disclosed. According to one exemplary embodiment of the present invention, a computerized model containing a plurality of truss elements along with one or more rollers is used. The truss elements are configured for modeling a muscle strand while each roller is configured for a joint. Each truss element includes two end nodes and is configured or associated with a muscle bio-mechanical property model (e.g., nonlinear Hill-type). Each roller is fixed at the location of a corresponding joint.

To simulate the muscle strand movements around the joint, each pair of truss elements straddling a roller is adjusted dynamically in a time-marching simulation (e.g., computer simulation of an impact event of an automobile and one or more occupants). Adjustments are performed at each solution cycle of the time-marching simulation. There are two types of adjustments "slipping" and "swapping".

Term "slipping" is referred to as local redefining of the truss element pair. Slipping is achieved by facilitating bio-mechanical property (e.g., in form of unstretched length of truss element) being passed from one element of the pair to the other. In other words, unstretched lengths of respective truss elements of the pair are redefined such that the total unstretched length of the pair is kept unchanged.

Term "swapping" is referred to as local remeshing of the plurality of truss elements. Swapping is achieved by facilitating one of the pair be moved to the other side of the roller. In other words, the truss elements for modeling a muscle strand are remeshed due to deletion of one element at one side of the roller and addition of another element at the other side. As a result, a different pair of truss elements straddles the roller after a swapping adjustment.

Objects, features, and advantages of the present invention will become apparent upon examining the following detailed description of an embodiment thereof, taken in conjunction with the attached drawings.

DETAILED DESCRIPTION OF EMBODIMENTS

In the following description, numerous specific details are set forth in order to provide a thorough understanding of embodiments of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Figure 1:
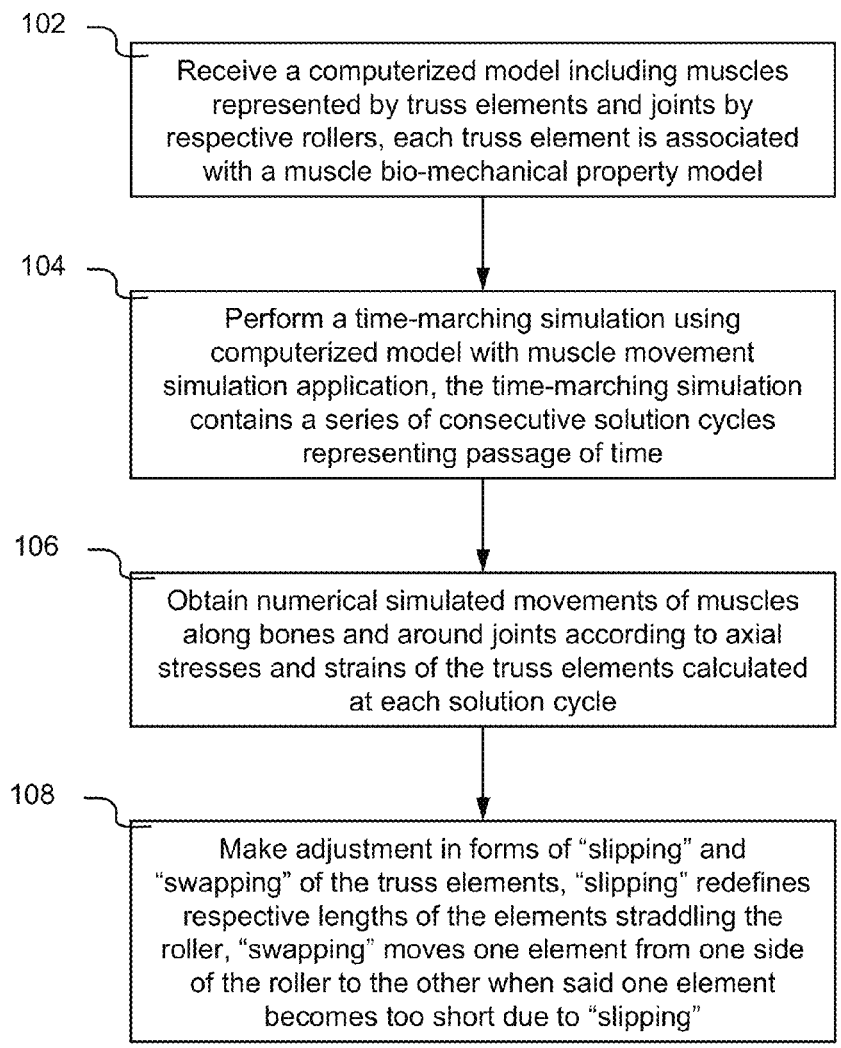
FIG. 1 is a flowchart illustrating an exemplary process of numerically simulating muscle movements along bones and around joints in accordance with one embodiment of the present invention.

Referring first to FIG. 1, it is shown a flowchart illustrating an exemplary process 100 of numerically simulating muscle movements along bones and around joints in accordance with an embodiment of the present invention. Process 100 is preferably implemented in software and understood with other figures.

Figure 2:
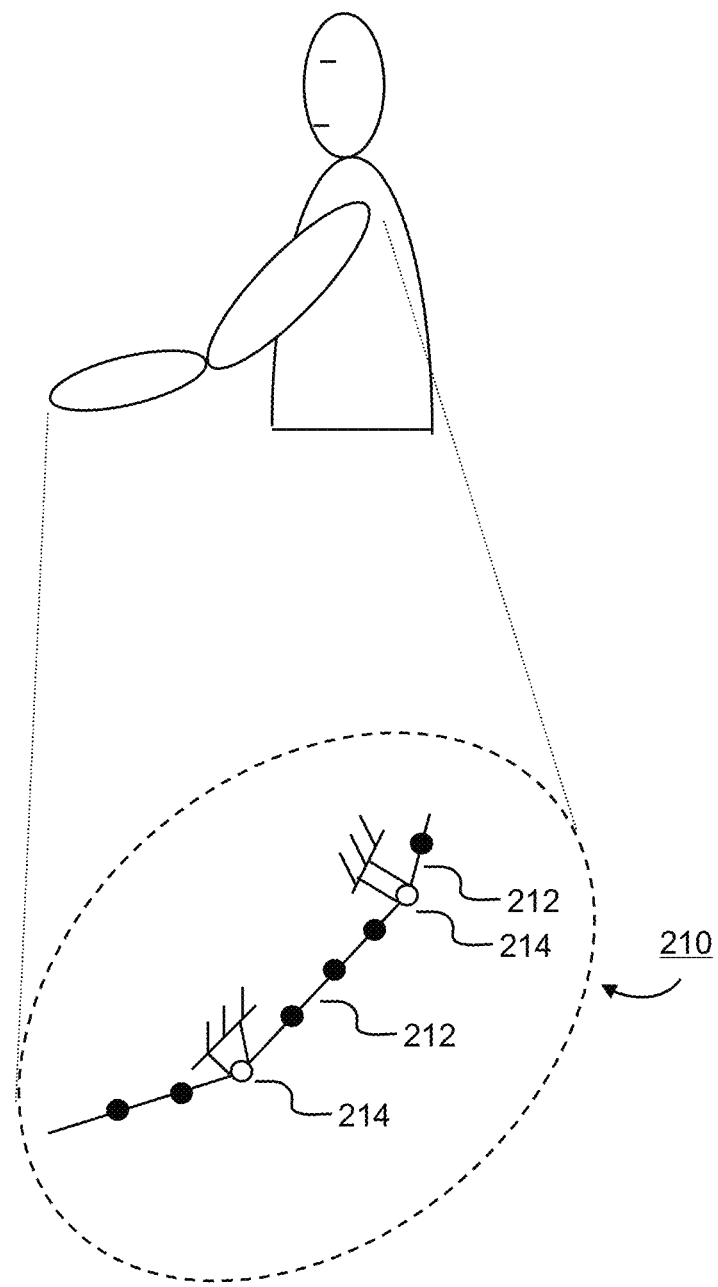
FIG. 2 is a diagram showing an exemplary computerized model of a muscle strand and a joint according to an embodiment of the present invention.

Process 100 starts by defining a computerized model (e.g., finite element analysis (FEA) model) of numerically simulating muscle movements at step 102. An exemplary computerized model 210 of a muscle strand and joints of an arm of a human is shown in FIG. 2. The computerized model 210 includes, among other things, a plurality of truss elements 212 representing a muscle strand and at least one roller 214 representing joints. The computerized model 210 is received in a computer system (e.g., computer system 700 shown in FIG. 7). Each truss element 212 has two end nodes that define the length of the element. In a three-dimensional space, each node has three translational degrees-of-freedom.

Figure 3:
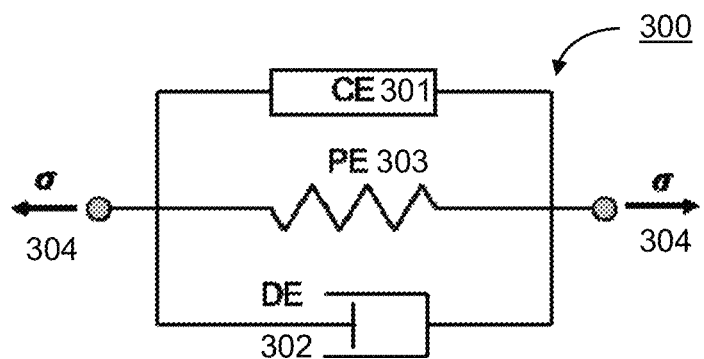
FIG. 3 is a diagram showing an exemplary muscle bio-mechanical property model in accordance with one embodiment of the present invention.

And each truss element is associated with a muscle bio-mechanical property model, for example, nonlinear Hill-type muscle bio-mechanical property model 300 shown in FIG. 3. The nonlinear Hill-type muscle model 300 emulates the muscle bio-mechanical property with a contractile element (CE) 301, a damper element (DE) 302 and a passive element (PE) 303 arranged in parallel.

The truss element configured with such bio-mechanical property model carries an axial force (i.e., tension or tensile force) depending on its cross-section area in response to the conditions during a numerical simulation. Tensile stress $\sigma$ 304 of the truss element is shown on two ends. Tensile stress 304 is calculated with well-known methods, for example, dividing the tensile force by the cross-section area of the truss element.

Contractile element 301 represents force generation by the muscle and it comprises maximum stress $\sigma_{max}$, a time-dependent activation level function $\alpha(t)$, a strain dependent scaling function $f(\epsilon)$, and a strain rate dependent scaling function $g(\dot{\epsilon})$: $\sigma_{CE} = \sigma_{max} \cdot \alpha(t) \cdot f(\epsilon) \cdot g(\dot{\epsilon})$.

Passive element 303 represents energy storage from muscle elasticity and it is composed of maximum stress $\sigma_{max}$ and a strain dependent non-linear elastic function $h(\epsilon)$: $\sigma_{PE} = \sigma_{max} \cdot h(\epsilon)$.

The damper element 302 represents muscular viscosity and it depends on strain, strain rate, and a damping constant: $\sigma_{DE} = D \cdot \epsilon \cdot \dot{\epsilon}$.

The resultant axial stress (i.e., tensile stress) 304 is the sum of all components: $\sigma = \sigma_{CE} + \sigma_{PE} + \sigma_{DE}$.

Figure 4:
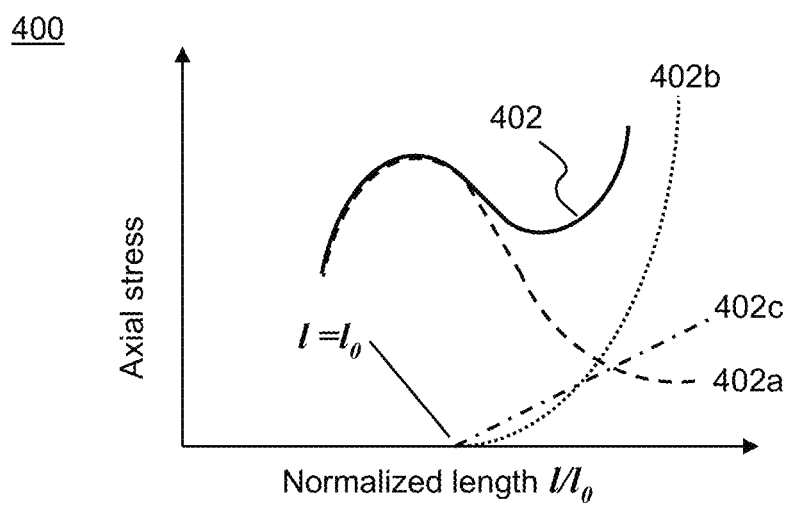
FIG. 4 is a diagram showing exemplary stress versus normalized length of a truss element associated with a muscle bio-mechanical property model according to an embodiment of the present invention.
Figure 5:
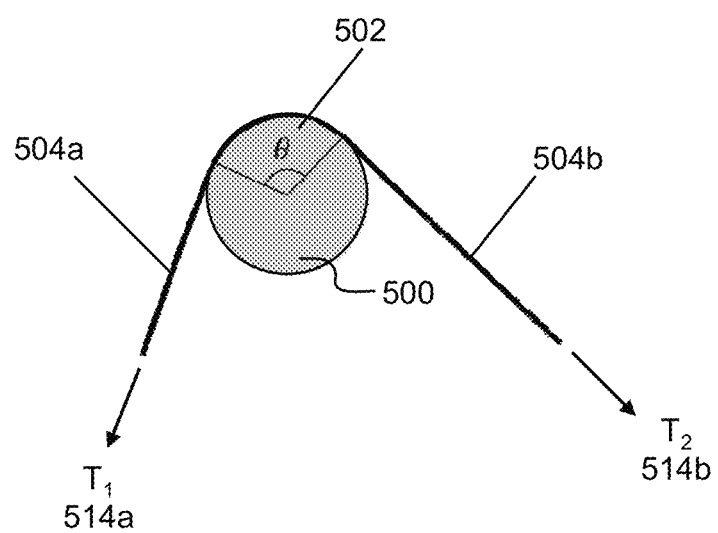
FIG. 5 is a diagram showing relationship between two axial forces/stresses around a roller for adjusting computerized model in accordance with one embodiment of the present invention.

A diagram 400 illustrating an exemplary nonlinear Hill-type bio-mechanical property model is shown in FIG. 4. Diagram 400 is an X-Y plot having a vertical axis of axial stress and a horizontal axis of normalized length of the truss element. Four curves 402 and 402a-c are shown. Curve 402 represents the total axial stress $\sigma$ while curve 402a represents $\sigma_{CE}$, curve 402b represents $\sigma_{PE}$ and curve 403c represents $\sigma_{DE}$. Normalized length of a truss element is a non-dimensional quantity calculated as a ratio of the current length (l) over the unstretched length ($l_o$). The unstretched length is the length of a truss element in the beginning of the time-marching simulation (i.e., Time=0), while the current length is the length at a particular solution cycle (i.e., Time=t). In other words, the normalized length is equal to one (1) at the beginning of the simulation. It is noted that strain $\epsilon$ is calculated as follows: $(l-l_o)/l_o$ or $(l/l_o)-1$.

Each roller 214 is fixed at the location of the joint with one node. The node (shown as hollow circle in FIG. 2) is shared with a pair of truss elements that straddles the roller. A roller 500 (e.g., roller 214) is configured with a wrap angle 502 shown in FIG. 5. Wrap angle 502 is determined by respective orientations of the pair of truss elements 504a-b that straddles the roller 500. In other words, wrap angle 502 is the inclusive angle formed by the pair of truss elements' axial direction.

Tensions $T_1$ 514a and $T_2$ 514b are corresponding axial forces of the truss elements 504a-b. The roller 500 used for numerically simulating muscle movements is subject to an equation referred to as Capstan equation $$T_2 = T_1 e^{\mu\theta}$$

where $T_2$ 514b is the high tension and $T_1$ 514a is the low tension, $\theta$ is wrap angle and $\mu$ is the coefficient of friction.

Next at step 104, process 100 performs a time-marching simulation using the computerized model with an application module configured for simulating muscle movements (e.g., finite element analysis (FEA) having elements configured for muscle movement simulations). The time-marching simulation contains a series of consecutive solution cycles or time steps representing passage of time. Various well-known techniques can be used for FEA, for example, explicit solution, implicit solution, etc. Generally, at each solution cycle, a set of nodal accelerations, velocities and displacements are obtained. Time history of these quantities is the numerical simulation result.

Once muscles and joints defined in the computerized model, the results of muscle movements are obtained in each solution cycle initially at step 106. For example, axial stresses and strains (i.e., stretches) of the truss elements are calculated at each solution cycle.

The simulated muscle movements along bones and around joints further include adjustments of truss elements to be realistic. The adjustments are made in forms of "slipping" and "swapping" at each joint (i.e., at each roller in the computerized model) at step 108.

For each pair of truss elements that straddles a roller, Capstan equation needs to be held. When the calculated axial forces of the pair of truss elements do not satisfy Capstan equation, an adjustment in form of "slipping" is made. The "slipping" adjustment redefines respective unstretched lengths of the pair of truss elements. In particular, the unstretched length of one element is reduced while the same amount is added at the other of the pair until Capstan equation is satisfied. Since the decreased length is equal to the increased length, the total unstretched length of the pair is kept constant. Further, the "slipping" adjustment is performed with a nonlinear iterative technique (e.g., Brent's method) that requires recalculating axial stresses and strains of the truss elements using adjusted computerized model.

When one of the pair of truss elements has become too short after one or more "slipping" adjustments, a "swapping" adjustment is made by removing the "too-short" element from its current location and adding it to the other side of the roller. In addition, the node associated with the roller is changed (see FIG. 6C and corresponding descriptions below). The "swapping" adjustment is also referred to as a local remeshing of the computerized model (i.e., remeshing of the connectivity of the truss elements). To determine whether an element is too short, well known methods can be used, for example, a predefined threshold value (e.g., a minimum length). Finally, to prevent the just moved element being thrashed back and forth, each remeshed element in a "swapping" adjustment is given a cushion in addition to the minimal length. For example, a 10% cushion means that the newly remeshed element (i.e., the element just moved from one side of the roller to the other side) is given a length equal to 1.1 times of the minimum length used as threshold.

Figure 6A:
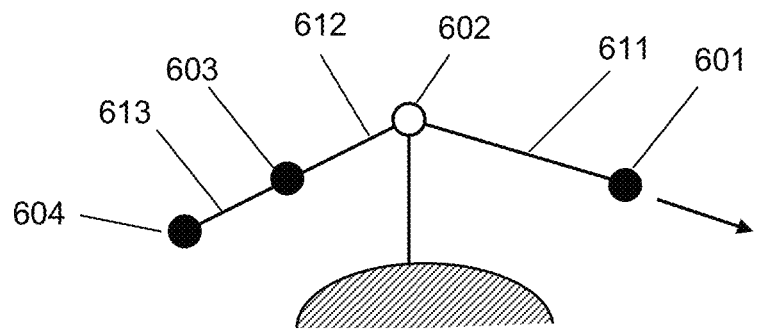
FIGS. 6A-6C are diagrams showing an exemplary "slipping" and "swapping" adjustment in accordance with one embodiment of the present invention.
Figure 6B:
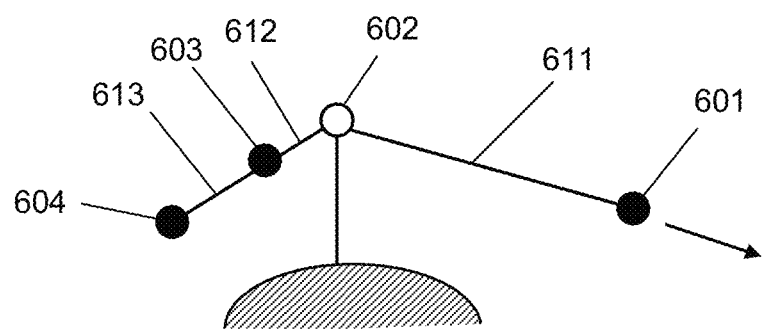
Figure 6C:
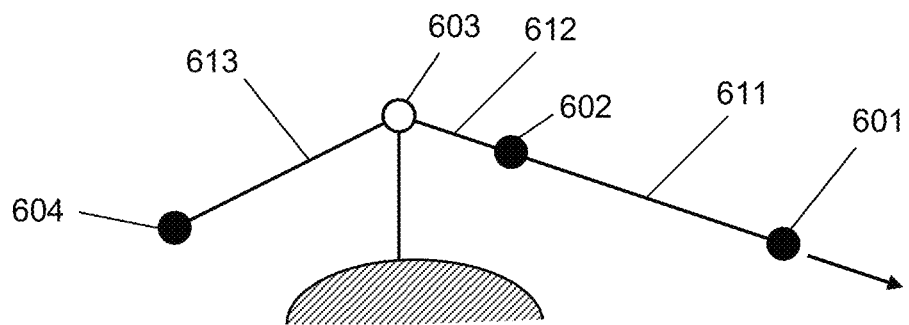

An exemplary sequence of "slipping" and "swapping" adjustment is shown in FIGS. 6A-6C, according to an embodiment of the present invention. For illustration simplicity, only three truss elements ("e1" 611, "e2" 612 and "e3" 613) and one roller (shown as hollow circle being fixed at a shaded area initially at node 602) is used in the exemplary sequence. Truss element "e1" 611 has two end nodes "n1" 601 and "n2" 602. Element "e2" 612 is defined by nodes "n2" 602 and "n3" 603 while element "e3" 613 is defined by nodes "n3" 603 and "n4" 604.

A first configuration of the exemplary sequence is shown in FIG. 6A. Elements "e1" 611 and "e2" 612 straddles the roller at common shared node "n2" 602. A second configuration shown in FIG. 6B is at a later time after the element axial stress and strain have been calculated. Capstan equation is checked at the roller at node 602. A "slipping" adjustment is made to redefine the respective unstretched lengths of elements "e1" 611 and "e2" 612. In this exemplary sequence, the unstretched length of element "e1" 611 is increased by the same amount decreased in element "e2" 612.

When element "e2" 612 is too short comparing to a threshold value (i.e., minimum length $l_{min}$), a "swapping" adjustment is made by moving element "e2" 612 from one side of the roller to the other side shown as a third configuration in FIG. 6C. As a result, the roller is associated with a different node 603 after the "swapping" adjustment.

A time history of muscle movements along bones and around joints is obtained by linking together the results at each solution cycle which represents the progress of time in the time-marching simulation.

According to one embodiment, the present invention is implemented in software with the following algorithm:

1) Standard force computation for each truss element
   Get unstretched length $l_o$
   Calculate the current length l and strain rate $\dot{\epsilon}$
   Calculate axial stress as a function of $l_o$, l and $\dot{\epsilon}$ ...

$\sigma = \sigma_{CE} + \sigma_{PE} + \sigma_{DE}$

Calculate axial force $T = A\sigma$

2) Force and length correction for each pair of truss elements that straddles the roller (i.e., "slipping" adjustment)
   Use calculated axial forces as trial values:
   Check Capstan equation
   If Capstan equation is met, use trial values as tension forces
   Otherwise, find root ($\Delta l$) of non-linear function using iterative technique $$\frac{T_2(l, l_0 + \Delta l, \dot{\epsilon}, \ldots)}{T_1(l, l_2 - \Delta l, \dot{\epsilon}, \ldots) \varepsilon^{\mu\varepsilon}} - 1 = 0$$

Figure 7:
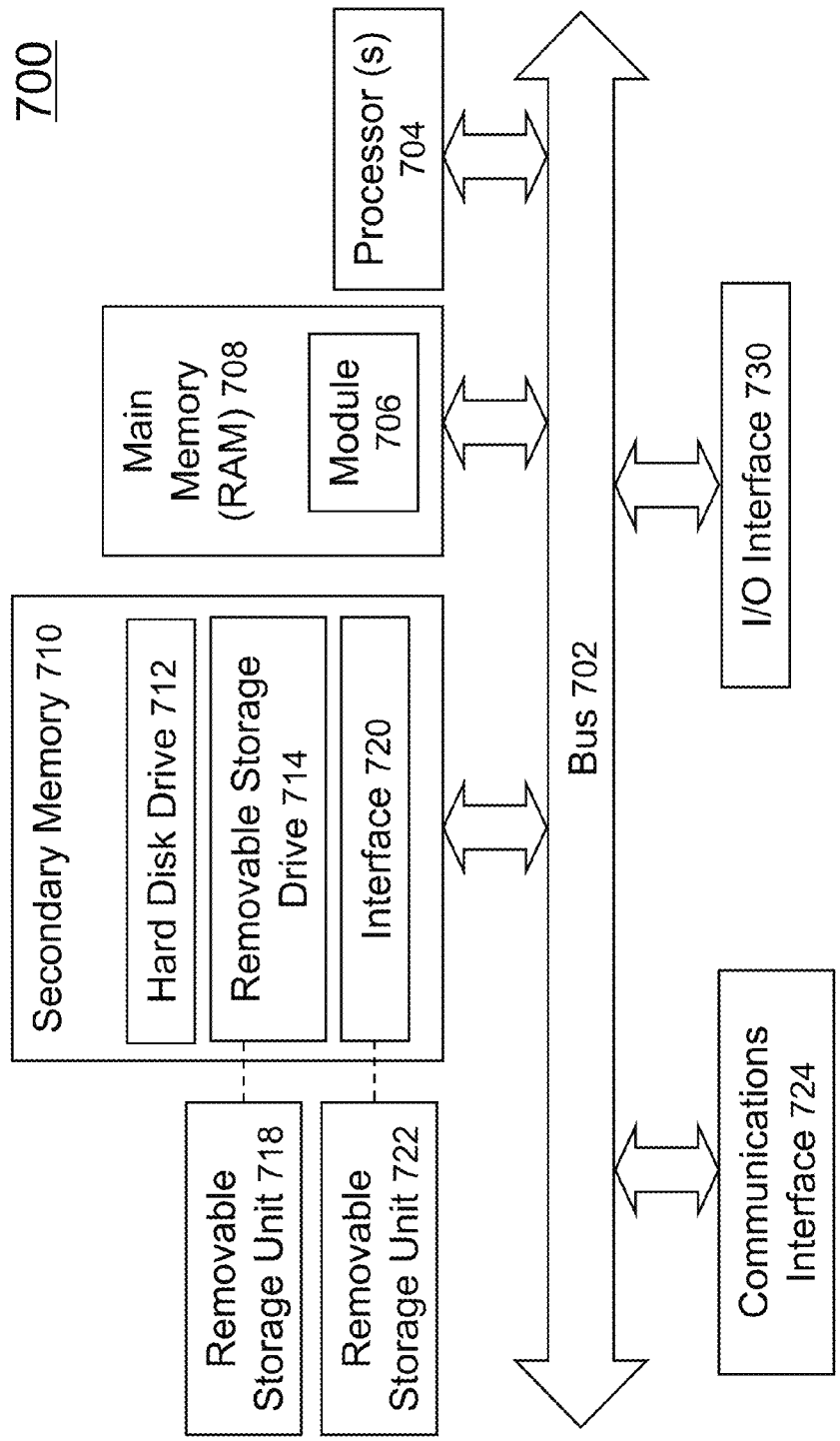
FIG. 7 is a function block diagram showing salient components of an exemplary computer system, in which one embodiment of the present invention may be implemented.

Update respective unstretched lengths of the pair of truss elements
   Use tensions calculated from the root 3) "Swapping" adjustment that moves a "too-short" element from one side to the other side of the roller
   Remesh truss elements when one of the pair has become "too-short" against a threshold (i.e., minimum length $l_{min}$)
   Change connectivity of truss elements
   Change node associated with the roller
   Create a new node for the just moved element to ensure it is long than $l_{min}$
   Modify element properties for the just moved element An embodiment of the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. Software and data transferred via communications interface 724 are in the form of signals which may be electronic, electromagnetic, optical, or other signals capable of being received by communications interface 724. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium", "computer usable medium", and "computer readable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the computer simulation of muscle movements (e.g., finite element analysis results) is reported to the user via the I/O interface 730 in either text or graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas muscles and joints in a human arm have been shown and described to be modeled as truss elements and rollers, other muscles and joints can be modeled, for example, leg muscles and knee or ankle joints. Additionally, whereas a nonlinear Hill-type muscle bio-mechanical property model has been shown and described, other suitable numerical model that emulates muscle bio-mechanical properties may be used. Moreover, whereas three truss elements and one roller have been shown and described for "slipping" and "swapping" adjustments, the present invention does not set limit as to how many truss elements and rollers to represent muscles and joints. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of numerically simulating muscle movements along bones and around joints comprising:
receiving, in a computer system having an application module configured for performing time-marching muscle movements simulation installed thereon, a computerized model containing a plurality of truss elements and at least one roller, said plurality of truss elements being configured to represent a muscle strand while each roller being configured to represent a joint and said plurality of truss elements being associated with a muscle bio-mechanical property model;
conducting the time-marching simulation using the computerized model with the application module in the computer system, the time-marching simulation containing a series of consecutive solution cycles representing passage of time;
calculating axial stresses and strains of said plurality of truss elements at each solution cycle; and
applying slipping and swapping adjustments to each truss element pair that straddles each roller to obtain numerically simulated movements of the muscle strand along bones and around joints.

2. The method of claim 1, wherein said slipping adjustment redefines respective unstretched length of each element of said each truss element pair.

3. The method of claim 2, wherein said swapping adjustment occurs when one element of said each truss element pair has become shorter than a threshold due to said slipping adjustment.

4. The method of claim 3, wherein said swapping adjustment moves said one element of said each truss element pair from a first side of said each roller to a second side.

5. The method of claim 4, wherein said one element of said each truss element pair is configured with a length greater than the threshold after said swapping adjustment.

6. The method of claim 2, wherein the respective unstretched lengths are iteratively determined using Capstan equation at said each roller.

7. The method of claim 6, wherein said Capstan equation is a function of respective axial stresses and strains of said each truss element pair and said each roller's wrap angle.

8. The method of claim 7, wherein said each roller's wrap angle is determined by respective orientations of said each truss element pair.

9. The method of claim 1, wherein the computerized model is a finite element analysis model.

10. The method of claim 1, wherein said muscle bio-mechanical property model comprises a nonlinear Hill-type muscle bio-mechanical property model.

11. The method of claim 1, wherein said each roller contains a node shared by said each truss element pair.

12. A non-transitory computer readable medium containing computer executable instructions for numerically simulating muscle movements along bones and around joints by a method comprising:

receiving, in a computer system having an application module configured for performing time-marching muscle movements simulation installed thereon, a computerized model containing a plurality of truss elements and at least one roller, said plurality of truss elements being configured to represent a muscle strand while each roller being configured to represent a joint and said plurality of truss elements being associated with a muscle bio-mechanical property model;

conducting the time-marching simulation using the computerized model with the application module in the computer system, the time-marching simulation containing a series of consecutive solution cycles representing passage of time;

calculating axial stresses and strains of said plurality of truss elements at each solution cycle; and applying slipping and swapping adjustments to each truss element pair that straddles each roller to obtain numerically simulated movements of the muscle strand along bones and around joints.

13. The computer readable medium of claim 12, wherein said slipping adjustment redefines respective unstretched length of each element of said each truss element pair.

14. The computer readable medium of claim 13, wherein said swapping adjustment occurs when one element of said each truss element pair has become shorter than a threshold due to said slipping adjustment.

15. The computer readable medium of claim 14, wherein said swapping adjustment moves said one element of said each truss element pair from a first side of said each roller to a second side.

16. The computer readable medium of claim 13, wherein the respective unstretched lengths are iteratively determined using Capstan equation at said each roller.

17. A system of numerically simulating muscle movements along bones and around joints comprising:

an input/output (I/O) interface;

a memory for storing computer readable code for one or more application modules configured for muscle movement simulation;

at least one processor coupled to the memory, said at least one processor executing the computer readable code in the memory to cause said one or more application modules to perform operations of:

receiving a computerized model containing a plurality of truss elements and at least one roller, said plurality of truss elements being configured to represent a muscle strand while each roller being configured to represent a joint and said plurality of truss elements being associated with a muscle bio-mechanical property model;

conducting the time-marching simulation using the computerized model with the application module in the computer system, the time-marching simulation containing a series of consecutive solution cycles representing passage of time;

calculating axial stresses and strains of said plurality of truss elements at each solution cycle; and applying slipping and swapping adjustments to each truss element pair that straddles each roller to obtain numerically simulated movements of the muscle strand along bones and around joints.

18. The system of claim 17, wherein said slipping adjustment redefines respective unstretched length of each element of said each truss element pair.

19. The system of claim 18, wherein said swapping adjustment occurs when one element of said each truss element pair has become shorter than a threshold due to said slipping adjustment and said swapping adjustment moves said one element of said each truss element pair from a first side of said each roller to a second side.

20. The system of claim 19, wherein the respective unstretched lengths are iteratively determined using Capstan equation at said each roller.

* * * * *